United States Patent [19]

Schilling et al.

[11] Patent Number: 5,101,414
[45] Date of Patent: Mar. 31, 1992

[54] ELECTRICALLY WAVELENGTH TUNABLE SEMICONDUCTOR LASER

[75] Inventors: Michael Schilling, Stuttgart; Klaus Wünstel, Schwieberdingen; Kaspar Dütting; Heinz Schweizer, both of Stuttgart, all of Fed. Rep. of Germany

[73] Assignee: Alcatel N.V., Amsterdam, Netherlands

[21] Appl. No.: 596,938

[22] Filed: Oct. 15, 1990

[30] Foreign Application Priority Data

Oct. 20, 1989 [DE] Fed. Rep. of Germany ....... 3934998

[51] Int. Cl.$^5$ .............................................. H01S 3/19
[52] U.S. Cl. ....................................... 372/50; 372/20; 372/32; 372/45; 372/46; 437/129
[58] Field of Search .................. 372/20, 32, 44, 45, 372/46, 48, 50; 357/16, 17; 437/129

[56] References Cited

U.S. PATENT DOCUMENTS

| | | | |
|---|---|---|---|
| 4,546,244 | 10/1985 | Miller | 250/211 J |
| 4,589,115 | 5/1986 | Burnham et al. | 372/20 |
| 4,817,110 | 3/1989 | Tokuda et al. | 372/45 |
| 4,835,788 | 5/1989 | Yamaguchi | 372/96 |
| 4,873,691 | 10/1989 | Uomi et al. | 372/20 |
| 4,888,783 | 12/1989 | Kojima et al. | 372/44 |
| 4,904,045 | 2/1990 | Alferness et al. | 350/96.19 |
| 4,908,833 | 3/1990 | Chraplyvy et al. | 372/96 |
| 4,935,936 | 6/1990 | Nelson et al. | 372/46 |
| 4,987,576 | 1/1991 | Heinen | 372/46 |

FOREIGN PATENT DOCUMENTS 0314490 5/1989 European Pat. Off. .
63-222487 9/1988 Japan .

OTHER PUBLICATIONS

Kittel, Charles; "Introduction To Solid State Physics", 5th Ed. (Ed. John Wiley & Sons Co., New York), 1976.
Farmer, et al., "Integrated LED Pumped Corrugated GaAs Distributive Feedback Laser," IBM Technical Disclosure Bulletin, vol. 17, No. 10, Mar. 1975, pp. 3070-3072.
Amann et al., "Tunable twin-guide laser: A novel laser diode with improved tuning performance", Appl. Phys. Lett. 54 (25), Jun. 19, 1989, pp. 2532, 2533.
Wilson et al., "Elements of Solid State Physics", p. 71, Display Devices, pp. 142-143, and Lasers 1, pp. 208-223, Optoelectronics: An Introduction, School of Physics, Newcastle upon Tyne Polytechnic, 1983.
Ashcroft et al., "Density of Levels", pp. 142-143, Number of Carriers in Thermal Equilibrium, pp. 572-573, and Appendix B, The Chemical Potential, p. 759, Solid State Physics, Saunders College, 1976.
William Streifer et al., "Coupling Coefficients for Distributed Feedbac Single-and Double-Heterostructure Diode Lasers," IEEE Journal of Quantum Electronics, vol. QE-11, No. 11, Nov. 1975, pp. 867-873.
Publication covering InP-Workshop at the Heinrich Hertz Institute, Berlin, Germany, May 8-9, 1989, M. C. Amann, "Continuously Tunable Laser Triode", (one page).
Article from periodical *Electronics Letters*, "Tunable DBR Laser with Wide Tuning Range", Kotake et al., Apr. 14, 1988, vol. 24, No. 8, pp. 503-505.

Primary Examiner—Georgia Epps
Attorney, Agent, or Firm—Spencer & Frank

[57] ABSTRACT

A semiconductor laser in which the photons injected from its waveguide region into the laser active region are those whose energies differ from the energy sum of the chemical potential of the electron-hole pairs and the energy of the longitudinal acoustic phonons by less than one-half the thermal energy is described. A current directed into the photon emission region in the area of the Bragg grating causes photons of this energy to be injected into the laser active region which is constituted of a layer of indium gallium arsenide phosphide.

15 Claims, 3 Drawing Sheets

ELECTRICALLY WAVELENGTH TUNABLE SEMICONDUCTOR LASER

CROSS REFERENCE TO RELATED APPLICATION

This application claims the priority of application Ser. No. P 39 34 998.5, filed Oct. 20, 1989, in the Federal Republic of Germany, the subject matter of which is incorporated herein by reference.

BACKGROUND OF THE INVENTION

1. Field of the Invention

The invention relates to a wavelength tunable semiconductor laser including a laser active region, a tunable frequency filter and a photon emission region from which photons are injected into the laser active region.

2. Background Information

The periodical, Electronics Letters, Volume 24, No. 8, of Apr. 14, 1988, discloses such a semiconductor laser at pages 503-505. This laser is composed of three longitudinally integrated regions, that is regions that are arranged next to one another in the longitudinal direction: a laser active region for light amplification, a controllable phase shifting region and a distributed Bragg reflector constituting the tunable frequency filter. It is disposed on the side of the laser active region and determines the Bragg wavelength of the waveguide region. Such a semiconductor laser is also called a multi-segment laser. In order to tune the wavelength of the laser light, currents are injected into the phase shifting region and into the waveguide region in the area of the Bragg grating; these currents change the Bragg wavelength because the refractive index in this region changes due to the plasma effect and the band filling effect.

The publication covering the InP-Workshop at the Heinrich Hertz Institute, Berlin, May 8-9, 1989, discloses a "continuously tunable laser triode"; this semiconductor laser is transversely integrated.

Only a single control current is required to tune its effective refractive index. In order to reduce the absorption of photons from the region of the Bragg grating, this region is produced of a material which has a higher band edge than the laser active region. However, this reduces the effect of the charge carrier injection in the laser active region since it is in the vicinity of the band edge of the semiconductor material that the plasma effect reaches its maximum. Varying the band masses of electrons and holes in the region of the Bragg grating also does not permit an injection of significantly more photons into the laser active region. It merely results in a suppression of the stimulated emission of photons in the region of the Bragg grating.

SUMMARY OF THE INVENTION

It is therefore an object of the present invention to provide a semiconductor laser into whose laser active region photons are injected in a more effective manner and which has a large continuously tunable wavelength range and a high light output power.

This is accomplished in that the photons injected from the photon emission region into the laser active region are those whose energy exceeds the sum of the energy of the potential of the electron-hole pairs and the energy of the longitudinal acoustic photons in the laser active region by less than one-half the thermal energy.

BRIEF DESCRIPTION OF THE DRAWINGS

One embodiment of the invention will now be described with reference to the drawing figures.

DETAILED DESCRIPTION OF THE PREFERRED EMBODIMENT

Figure 1:
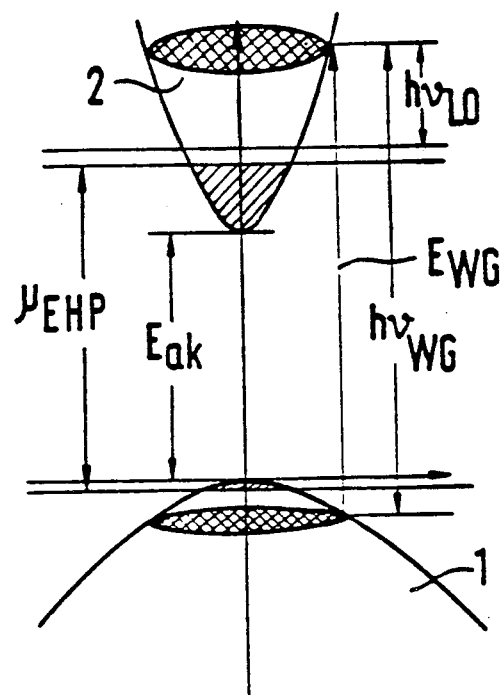
FIG. 1 is a schematic representation of the band structure in the active laser region.

If the laser active region of a semiconductor laser is composed of a direct semiconductor material, valence band A and conduction band B (FIG. 1) in the laser active region of the semiconductor laser have their band edges at the same location in the Brillouin zone.

The band gap at this location corresponds to a band gap energy $E_{ak}$. The difference between the chemical potentials of the electrons in conduction band B and the holes in valence band A, that is, the chemical potential of the electron-hole plasma, is marked $u_{EHP}$. Due to the Fermi distribution, the state density of the electrons appears "smudged" which can be expressed by the product of the Boltzmann constant $k_B$ and the temperature T, $k_B \cdot T$.

If now photons are injected at an energy $h\nu_{WG}$ from the photon emission region of the semiconductor laser into the laser active region, they are each able to raise one electron from the valence band A into conduction band B. This causes one phonon of the longitudinal optical mode (LO) to be scattered with an energy $h\nu_{LO}$ if the electron generated by the photon injection lies above the chemical potential of the electron-hole plasma (EHP) in the laser active region at least by the magnitude of the phonon energy. In order to prevent this process, the band edge energy of the waveguide region, $E_{WG} = h\nu_{WG}$, must meet the condition that it be less than or equal to the energy $h\nu_{LO}$ of the phonon, with reference to the chemical potential $\nu_{EHP}$:

$$E_{WG} \leq \mu_{EHP} + h\nu_{LO} \pm \frac{k_B T}{2}$$

The term $$\frac{k_B T}{2}$$

in the inequality indicates the range of fluctuation of the energy distribution at a temperature T.

This causes electrons in the laser active region to take on an energy position from which acoustic photons are able to scatter them toward lower energies only at a reduced frequency. In particular, such electrons do not contribute to stimulated emission. Thus it is possible to locally increase the electron density N in the laser active region to beyond the laser threshold density. A density N beyond the threshold density permits variation of the dielectric constant according to the density dependence of the dielectric constants. Due to the interdependence of the change in Bragg wavelength $\Lambda$ and the change in dielectric constants and the relationship between the change in the dielectric constant and the change in charge carrier density N $$\frac{\Delta\Lambda}{\Lambda} = \frac{\Delta n}{n} = \frac{\Delta N}{N}$$

the emission wavelength of the semiconductor laser can be tuned. In the above relationship, n represents the refractive index.

Figure 2:
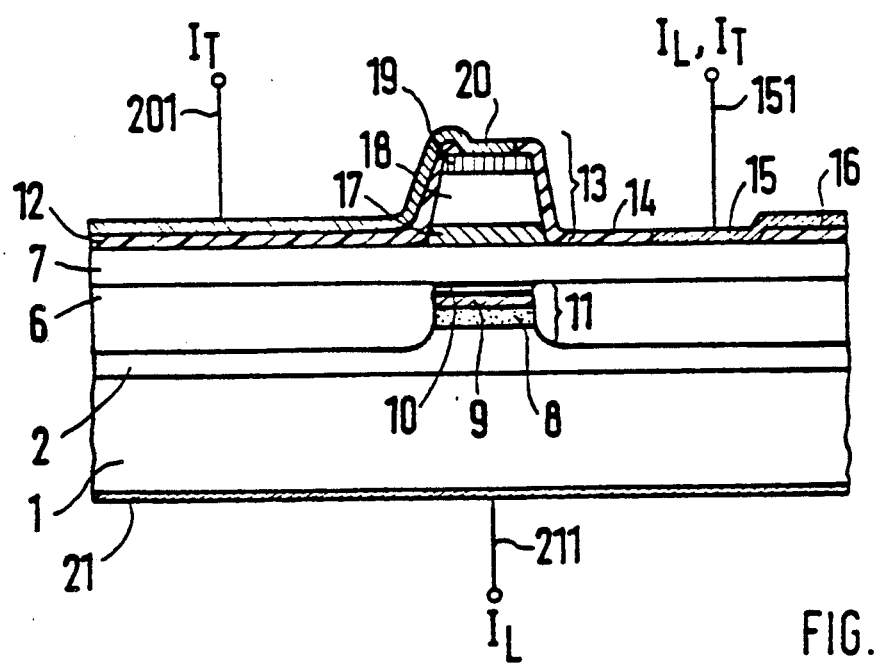
FIG. 2 is a diagram of the structure of a wavelength tunable semiconductor laser.

An active layer 9 (FIG. 2) and a layer 17 forming the photon emission region, both meeting the above conditions, are part of a semiconductor laser shown in the transversal direction, that is, in cross section. Layers 9 and 17 may lie above or below one another or adjacent to one another. The semiconductor laser is produced on a semiconductor substrate 1, here a p-type InP substrate.

On the underside of semiconductor substrate 1, there is a thin metal layer 21 provided with an electrical contact 211. Above the p-type InP substrate 1 there is a further p-type InP layer 2 which has an upwardly thickened portion in the center constituting the lower portion of a mesa 11. The p-type InP layer 2 serves as buffer layer. On its top side, it is provided with a tunable Bragg grating which acts as frequency filter.

Above it, mesa 11 contains a layer 8 of a quaternary semiconductor compound, here p-type InGaAsP, forming a waveguide region and an active layer 9, likewise composed of a quaternary semiconductor compound, here InGaAsP, and constituting the laser active region. Layer 8 has a greater band gap between valence band and conduction band than layer 9.

Instead of a single waveguide region and a single laser active zone, quantum well layers may also be provided. Above active layer 9, an InP layer 10 constitutes the uppermost layer of mesa 11. On both sides of mesa 11, there lies a semi-insulating layer 6 of InP which extends to the height of mesa 11. Above mesa 11 and InP layer 6, there lies a layer 7 of n-type InP which extends over the entire cross section of the semiconductor laser and is covered by a dielectric layer 12 of SiO₂, above mesa 11 by a mesa 13, a further dielectric layer 14 of SiO₂, a metal layer 15 and a third dielectric layer 16 of SiO₂. Some other dielectric material may also be used instead of SiO₂.

Mesa 13 is composed of an InGaAsP layer constituting photon emission region 17, a p-type InP layer 18 serving as covering layer and a p⁺-type InGaAs or a p-type InGaAsP layer 19 serving as contact layer. Above the latter, there is again provided a metal layer 20 which on the sides also covers layer 12 and is provided with a electrical contact 201.

Metal layer 15 is provided with a contact 151. A current I$_T$ for tuning the photon injection from photon emission region 17 flows through contacts 151 and 201. Contact 151 together with contact 211 simultaneously serve to pick up the laser control current I$_L$.

In another embodiment not shown here, the upper side of layer 7 is also provided with a Bragg grating above mesa 11. This is a higher order grating while the Bragg grating on layer 2 is a grating of the first order. In this case, the semiconductor laser has two waveguide layers.

Figure 3A:
FIGS. 3a-3f show successive steps in producing the structure of a second wavelength tunable semiconductor laser.
Figure 3B:
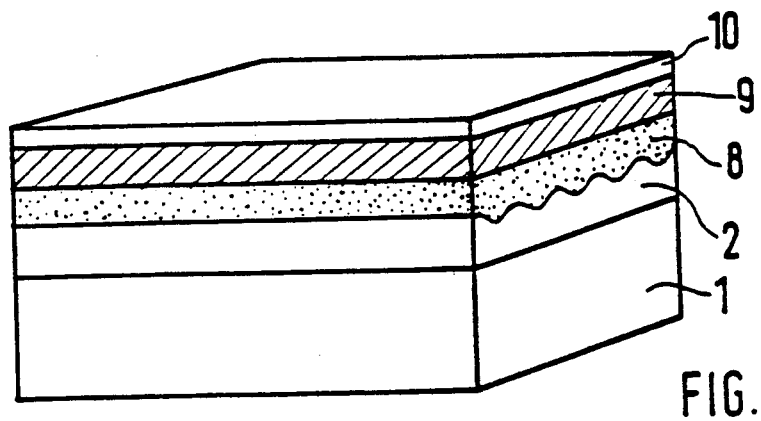
Figure 3C:
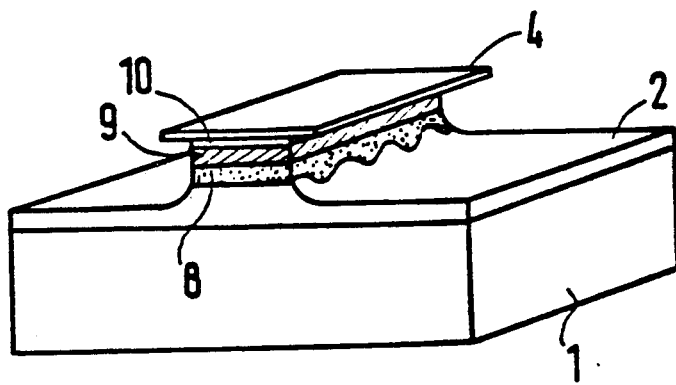

The semiconductor laser (FIG. 2) can be produced in that a diffraction grating is etched either directly onto semiconductor substrate 1 (FIG. 3a) or initially the p-type InP layer 2 is epitaxially applied as a buffer layer onto the semiconductor substrate 1 and then the Bragg grating is etched onto it (FIG. 3b). Thereafter, layers 8, 9 and 10 are precipitated epitaxially. A layer 4 of a dielectric material, e.g. SiO₂/Si₃N₄, is applied over layer 10 to be removed in a lithographic process down to a narrow strip of about 2 μm in width so that mesa 11 (FIG. 3c) is produced by completely etching away layers 8, 9 and 10 lateral to this narrow strip and partially etching away the p-type InP layer 2 and the semiconductor substrate 1, respectively (see FIG. 3a).

Figure 3D:
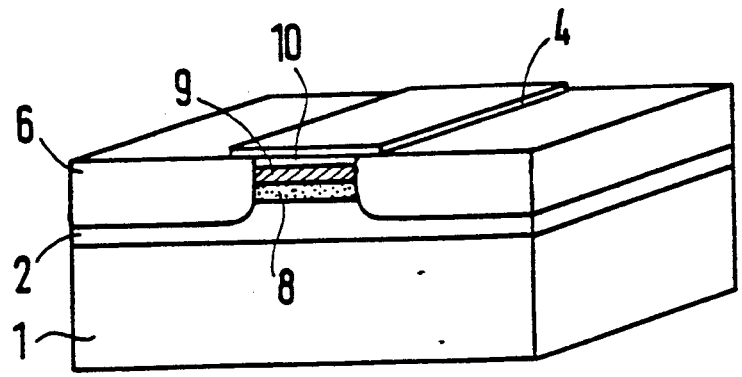
Figure 3E:
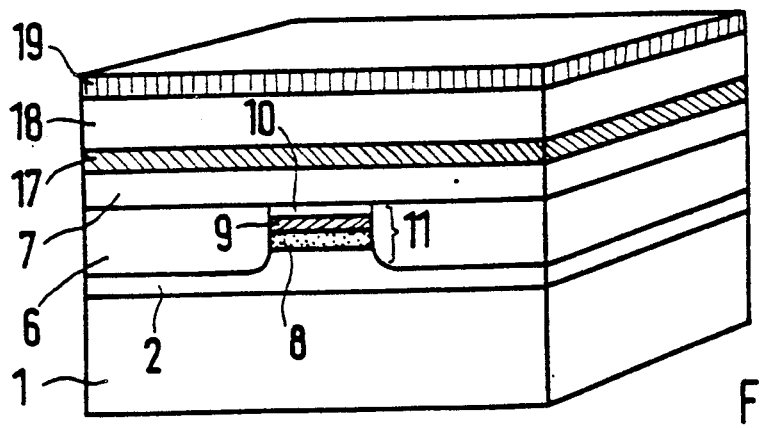

Then, by means of selective epitaxy, layer 6 (FIG. 3d) is precipitated as a current blocking lateral region. Then, SiO₂/SiO₃N₄ layer 4 is removed (FIG. 3e), and layer 7, photon emission region 17 and layers 18 and 19 are epitaxially precipitated.

Figure 3F:
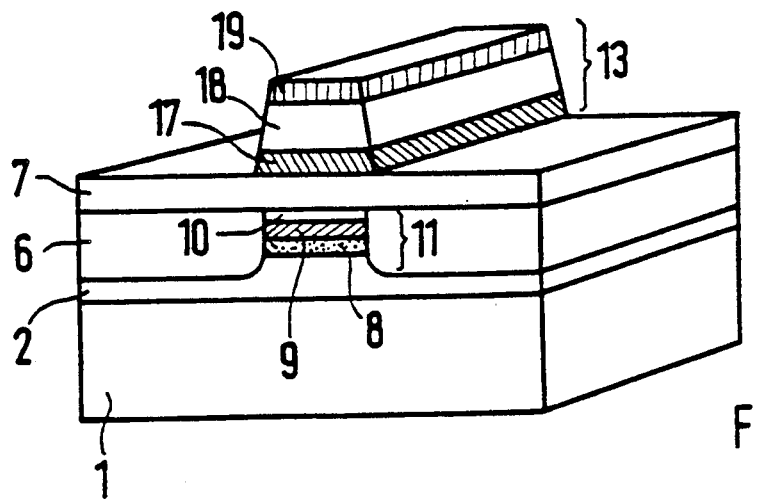

After renewed lithographic structuring (see FIG. 3c), mesa 13 is produced by selectively etching away photon emission region 17, p-type InP layer 18 and p⁺-type InGaAs or p⁺-type InGaAsP layer 19 (FIG. 3f).

Mesa 13 as well as n-type InP layer 7 on both sides of mesa 13 are covered by an SiO₂ layer. Above mesa 13 and at a location to the side of mesa 13, the SiO₂ layer is etched away. This creates layers 12, 14 and 16. Then three metal layers 15, 20 and 21 are applied of which the first two layers cover the etched-away locations and metal layer 21 covers substrate 1 from the bottom. Each one of the three metal layers 15, 20 and 21 is provided with an electrical contact 151, 201, and 211, respectively (see FIG. 2).

It will be understood that the above description of the present invention is susceptible to various modifications, changes and adaptations, and the same are intended to be comprehended within the meaning and range of equivalents of the appended claims.

What is claimed is:

1. In an electrically wavelength tunable semiconductor laser, the laser including:
   a laser active region composed of a direct semiconductor material having a valence band containing electrons and a conduction band containing holes, and a scattering energy of a phonon of the longitudinal optical mode therein;
   a waveguide region disposed adjacent to a surface of said laser active region and having an associated band edge energy;
   a tunable frequency filter disposed adjacent to a surface of said waveguide region opposite said laser active region; and
   a photon emission region, disposed one of above a surface of said laser active region opposite said wavelength region, below a surface of said laser active region opposite said waveguide region, and in the same plane as a surface of the laser active region, from which photons are emitted and injected into the laser active region;
   wherein the waveguide region and band edge energy is less than or equal to the sum of: the energy difference between the potentials of electrons in the laser active region conduction band and holes in the laser active region valence band; and the scattering energy of a phonon of the longitudinal optical mode in the laser active region; plus or minus a fluctuation range due to electron/hole distribution at a given temperature;
   whereby electron density in the laser active region is increased beyond laser threshold density thereby permitting variation of the dielectric constant therein so that the emission wavelength of the laser can be tuned with the frequency filter.

2. A semiconductor laser according to claim 1, wherein a current for tuning the photon injection flows from the photon emission region into the laser active region.

3. A semiconductor laser according to claim 1, wherein:
the frequency filter is a Bragg grating 4. A semiconductor laser according to claim 3, wherein the photon emission region is configured as a waveguide zone.

5. A semiconductor laser according to claim 1, wherein the photon emission region is composed of a III-V semiconductor compound.

6. A semiconductor laser according to claim 3, wherein a further Bragg grating is provided disposed adjacent a surface of said photon emission region, and wherein the further Bragg grating is a higher order grating.

7. A semiconductor laser according to claim 6, wherein its laser active region is composed of a quaternary semiconductor compound.

8. A semiconductor laser according to claim 7, wherein it is composed of a plurality of superposed layers said layers including:
a first metal layer provided with a first electrical contact;
a semiconductor substrate;
a first p-conductive indium phosphide layer provided on its top side with the Bragg grating;
a layer composed of p-conductive indium gallium arsenide phosphide, a layer of indium gallium arsenide phosphide forming the laser active region, an indium phosphide layer, these three layers, together with the first p-conductive indium phosphide layer thickened in the region underneath them, form a first mesa;
semi-insulating layer disposed to the side of the first mesa above the p-conductive indium phosphide layer;
a layer of n-conductive indium phosphide disposed on the first mesa and on the semi-insulating layer;
a first dielectric layer, a base layer of a second mesa, a second dielectric layer, a second metal layer provided with a second electrical contact and a third dielectric layer disposed next to one another in the transversal direction on the n-conductive indium phosphide layer;
the second mesa including the base layer composed of a photon emission region of indium gallium arsenide phosphide, a second p-conductive indium phosphide layer and a layer of one of either p+-conductive indium gallium arsenide or p+-conductive indium gallium arsenide phosphide, said second mesa being covered on the top by a third metal layer and on the sides by the first and second dielectric layers, the third metal layer being provided with a third electrical contact.

9. The semiconductor laser of claim 8, produced by the method comprising the steps of:
producing epitaxially a first p-conductive indium phosphide layer on a p-conductive indium phosphide substrate;
etching a diffraction grating on the first p-conductive indium phosphide layer;
applying epitaxially a layer of p-conductive indium gallium arsenide phosphide, a layer of indium gallium arsendie phsophide and an indium phosphide layer applied on to the etched first p-conductive indium phosphide layer;
applying a layer of a dielectric material over the indium phosphide layer and removing it except for a strip extending longitudinally over the center of the indium phosphide layer;
etching way completely, except for an area defined by the strip of dielectric material, the p-conductive indium gallium arsenide phosphide layer, the indium gallium arsenide phosphide layer and the indium phosphide layer and etching away partially the first p-conductive indium phosphide layer thus producing a first mesa;
applying a layer of semi-insulating indium phosphide on both sides of the first mesa onto the first p-conductive indium phosphide layer;
removing the remaining strip of dielectric material;
precipitating epitaxially an n-conductive indium phosphide layer, a phonton emission region, a second p-conductive indium phosphide layer and one of either of a p+-conductive indium gallium arsenide layer or an indium gallium arsenide phosphide layer onto the first mesa and the layer of semi-insulating indium phosphide;
producing a second mesa above the first mesa, by partially etching away the photon emission region, the second p-conductive indium phosphide layer and the layer of one of either p+-conductive indium gallium arsenide or indium gallium arsenide phosphide;
covering the second mesa and the n-conductive indium phosphide layer are covered with a covering dielectric layer on both sides of the second mesa;
etching away the covering dielectric layer above and at a location to the side of the second mesa so that first, second and third dielectric layers are created;
applying metal layers onto the first and third dielectric layers and onto the p-conductive indium phosphide substrate and providing each of the metal layers with an electrical contact.

10. A method of producing a semiconductor laser comprising the steps of:
producing epitaxially a first p-conductive indium phosphide layer on a p-conductive indium phosphide substrate;
etching a diffraction grating on the first p-conductive indium phosphide layer;
applying eptaxially a layer of p-conductive indium gallium arsenide phosphide, a layer of indium gallium arsenide phosphide and an indium phosphide layer applied on to the etched first p-conductive indium phosphide layer;
applying a layer of a dielectric material over the indium phosphide layer and removing it except for a strip extending longitudinally over the center of the indium phosphide layer;
etching away completely, except for an area defined by the strip of dielectric material, the p-conductive indium gallium arsenide phosphide layer, the indium gallium arsenide phosphide layer and the indium phosphide layer and etching away partially the first p-conductive indium phosphide layer thus producing a first mesa;
applying a layer of semi-insulating indium phosphide on both sides of the first mesa onto the first p-conductive indium phosphide layer;
removing the remaining strip of dielectric material;
precipitating epitaxially an n-conductive indium phosphide layer, a photon emission region, a second p-conductive indium phosphide layer and on of either of a p+-conductive indium gallium arsenide layer or an indium gallium arsenide phosphide layer onto the first mesa and the layer of semi-insulating indium phosphide;

producing a second mesa above the first mesa, by partially etching away the photon emission region, the second p-conductive indium phosphide layer and the layer of one of the either p+-conductive indium gallium arsenide or indium, gallium arsenide phosphide;

covering the second mesa and the n-conductive indium phosphide layer are covered with a covering dielectric layer on both sides of the second mesa;

etching away the covering dielectric layer above and at a location to the side of the second mesa so that first, second and third dielectric layers are created;

applying metal layers onto the first and third dielectric layers and onto the p-conductive indium phosphide substrate and providing each of the metal layers with an electrical contact.

11. A method of forming a laser having a waveguide region and a laser active region, and in which the photons injected from the waveguide region into the laser active region are photons whose energy exceeds the sum of the energy of the chemical potential of electron-hole pairs and the energy of the longitudinal acoustic phonons in the laser active region by less than one-half the thermal energy, comprising the steps of:

producing epitaxially a first p-conductive indium phosphide layer on a p-conductive indium phosphide substrate;

etching a diffraction grating on the first p-conductive indium phosphide layer;

applying epitaxially a layer of p-conductive indium gallium arsenide phosphide, a layer of indium gallium arsenide phosphide and an indium phosphide layer applied on to the etched first p-conductive indium phosphide layer;

applying a layer of a dielectric material over the indium phosphide layer and removing it except for a strip extending longitudinally over the center of the indium phosphide layer;

etching away completely, except for an area defined by the strip of dielectric material, the p-conductive indium gallium arsenide phosphide layer, the indium gallium arsenide phosphide layer and the indium phosphide layer and etching away partially the first p-conductive indium phosphide layer thus producing a first mesa;

applying a layer of semi-insulating indium phosphide on both sides of the first mesa onto the first p-conductive indium phosphide layer;

removing the remaining strip of dielectric material;

precipitating epitaxially an n-conductive indium phosphide layer, a photon emission region, a second p-conductive indium phosphide layer and one of either of a p+-conductive indium gallium arsenide layer or an indium gallium arsenide phosphide layer onto the first mesa and the layer of semi-insulating indium phosphide;

producing a second mesa above the first mesa, by partially etching away the photon emission region, the second p-conductive indium phosphide layer and the layer of one of either p+-conductive indium gallium arsenide or indium gallium arsenide phosphide;

covering the second mesa and the n-conductive indium phosphide layer are covered with a covering dielectric layer on both sides of the second mesa;

etching away the covering dielectric layer above and at a location to the side of the second mesa so that first, second and third dielectric layers are created;

applying metal layers onto the first and third dielectric layers and onto the p-conductive indium phosphide substrate and providing each of the metal layers with an electrical contact.

12. In a wavelength tunable semiconductor laser:

a first mesa having a laser active region and a waveguide region disposed adjacent one another; and a second mesa, having a photon emission region, disposed vertically above the first mesa.

13. In the laser according to claim 12, wherein the first mesa has a first Bragg filter disposed adjacent a lower surface thereof.

14. In the laser according to claim 13, wherein a second Bragg filer is provided, the second Bragg filter being disposed between the first and second mesas adjacent to a lower surface of said photon emission region, the second Bragg filter being of a high order relative to the first Bragg filter.

15. In the laser according to claim 12, wherein the laser is formed of a plurality of superposed layers said layers comprising from bottom to top:

a first metal layer provided with a first electrical contact;

a semiconductor substrate;

the first mesa comprised of:
a first p-conductive indium phosphide layer provided on its top side with the first Bragg filter;
a layer composed of p-conductive indium gallium arsenide phosphide;
a layer of indium gallium arsenide phosphide forming the laser active region; and
an indium phosphide layer;

a semi-insulating layer disposed to the sides of the first mesa above the p-conductive indium phosphide layer;

a layer of n-conductive indium phosphide disposed on the first mesa and on the semi-insulating layer;

a first dielectric layer, a base layer of the second mesa, a second dielectric layer, a second metal layer provided with a second electrical contact and a third dielectric layer disposed next to one another in the transversal direction on the n-conductive indium phosphide layer;

the second mesa including the base layer composed of a photon emission region of indium gallium arsenide phosphide, a second p-conductive indium phosphide layer and a layer of one of either p+-conductive indium gallium arsenide or p+-conductive indium gallium arsenide phosphide, said second mesa being covered on the top by a third metal layer and on the sides by the first and second dielectric layers, the third metal layer being provided with a third electrical contact.

* * * * *